United States Patent
Guo et al.

(10) Patent No.: US 8,324,059 B2
(45) Date of Patent: Dec. 4, 2012

(54) METHOD OF FABRICATING A SEMICONDUCTOR STRUCTURE

(75) Inventors: Ted Ming-Lang Guo, Tainan (TW); Chin-Cheng Chien, Tainan (TW); Shu-Yen Chan, Changhua County (TW); Chan-Lon Yang, Taipei (TW); Chun-Yuan Wu, Yunlin County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/092,990

(22) Filed: Apr. 25, 2011

(65) Prior Publication Data

US 2012/0270377 A1 Oct. 25, 2012

(51) Int. Cl.
*H01L 21/336* (2006.01)
(52) U.S. Cl. ............... 438/300; 438/481; 257/E21.619
(58) Field of Classification Search ............ 438/301, 438/299, 300, 481; 257/E21.619
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbé |
| 5,783,478 A | 7/1998 | Chau |
| 5,783,479 A | 7/1998 | Lin |
| 5,793,090 A | 8/1998 | Gardner |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |

(Continued)

OTHER PUBLICATIONS

Carl Galewski et al., "Silicon Wafer Preparation for Low-Temperature Selective Epitaxial Growth", IEEE Transactions on Semiconductor Manufacturing, vol. 3, No. 3, Aug. 1990, p. 93-98.

(Continued)

*Primary Examiner* — Thanhha Pham
(74) *Attorney, Agent, or Firm* — Winston Hsu; Scott Margo

(57) ABSTRACT

A method of fabricating a semiconductor structure, in which after an etching process is performed to form at least one recess within a semiconductor beside a gate structure, a thermal treatment is performed on the recess in a gas atmosphere including an inert gas before a silicon-containing epitaxial layer is formed in the recess through an epitaxy growth process.

11 Claims, 4 Drawing Sheets

U.S. PATENT DOCUMENTS

| | | |
|---|---|---|
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,949,482 B2 | 9/2005 | Murthy |
| 6,972,461 B1 | 12/2005 | Chen |
| 6,991,979 B2 | 1/2006 | Ajmera |
| 6,991,991 B2 | 1/2006 | Cheng |
| 7,033,895 B2 | 4/2006 | Lee |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,176,504 B1 | 2/2007 | Lin |
| 7,183,596 B2 | 2/2007 | Wu |
| 7,202,124 B2 | 4/2007 | Fitzgerald |
| 7,217,627 B2 | 5/2007 | Kim |
| 7,259,050 B2 | 8/2007 | Chen |
| 7,288,822 B1 | 10/2007 | Ting |
| 7,335,959 B2 | 2/2008 | Curello |
| 7,410,859 B1 | 8/2008 | Peidous |
| 7,494,856 B2 | 2/2009 | Zhang |
| 7,560,758 B2 | 7/2009 | Zhu |
| 7,592,231 B2 | 9/2009 | Cheng |
| 7,667,227 B2 | 2/2010 | Shimamune |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0134872 A1 | 6/2006 | Hattendorf |
| 2006/0138398 A1* | 6/2006 | Shimamune et al. ........... 257/19 |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0082451 A1 | 4/2007 | Samoilov |
| 2007/0128783 A1 | 6/2007 | Ting |
| 2007/0128786 A1 | 6/2007 | Cheng |
| 2007/0166929 A1 | 7/2007 | Matsumoto |
| 2007/0262396 A1 | 11/2007 | Zhu |
| 2008/0014688 A1 | 1/2008 | Thean |
| 2008/0076236 A1 | 3/2008 | Chiang |
| 2008/0085577 A1 | 4/2008 | Shih |
| 2008/0116525 A1 | 5/2008 | Liu |
| 2008/0124874 A1* | 5/2008 | Park et al. .................. 438/285 |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0095992 A1 | 4/2009 | Sanuki |
| 2009/0108291 A1 | 4/2009 | Cheng |
| 2009/0117715 A1 | 5/2009 | Fukuda |
| 2009/0124056 A1 | 5/2009 | Chen |
| 2009/0166625 A1 | 7/2009 | Ting |
| 2009/0186475 A1 | 7/2009 | Ting |
| 2009/0246922 A1 | 10/2009 | Wu |
| 2009/0278170 A1 | 11/2009 | Yang |
| 2010/0001317 A1 | 1/2010 | Chen |
| 2010/0093147 A1 | 4/2010 | Liao |

OTHER PUBLICATIONS

Emmanuel Augendre et al., "Elevated Source/Drain by Sacrificial Selective Epitaxy for High Performance Deep Submicron CMOS: Process Window versus Complexity", IEEE Transactions on Electron Devices, vol. 47, No. 7, Jul. 2000, p. 1484-p. 1491.

Naruhisa Miura et al., "Junction Capacitance Reduction Due to Self-Aligned Pocket Implantation in Elevated Source/Drain NMOSFETs", IEEE Transactions on Electron Devices, vol. 48, No, 9, Sep. 2001, p. 1969-p. 1974.

Junichi Murota et al., "CVD SiGe(C) Epitaxial Growth and Its Application to MOS Devices", 2001 IEEE, p. 525-p. 530.

Kiyotaka Miyano et al., "SPE$^2$~Novel 700° C. Selective Epitaxial Growth Technology for Elevated Source/Drain", Extended abstracts of International Workshop on Junction Technology 2001, p. 5-2-1-p. 5-2-4.

* cited by examiner

METHOD OF FABRICATING A SEMICONDUCTOR STRUCTURE

BACKGROUND OF THE INVENTION

1. Field of the Invention

The present invention relates to a method of fabricating a semiconductor structure, and particularly to a method of fabricating a semiconductor structure during which rounding problem of an epitaxial layer can be avoided or reduced.

2. Description of the Prior Art

As the semiconductor processes advance to very deep sub micron era such as 65-nm node, even 28 nm or beyond, how to increase the driving current for MOS transistors has become a critical issue. In order to improve device performance, strained-silicon technology has been developed. Putting a strain on a semiconductor crystal alters the speed at which charges move through that crystal. Strain makes MOS transistors work better by enabling electrical charges, such as electrons, to pass more easily through the silicon lattice of the gate channel.

One of the methods to put a strain on the silicon lattice of the gate channel is that combining a selective epitaxial growth (SEG) technology. Recesses are formed in the substrate beside the gate structure and then an epitaxial layer, such as silicon germanium (SiGe) layer having a crystal lattice arrangement the same as that of the substrate is formed within the recesses through the epitaxial growth process to serve as a source/drain, so as to apply a stress to the crystal lattice of the gate channel.

FIG. 1 is a schematic, cross-sectional view illustrating a conventional semiconductor structure. As shown in FIG. 1, in the semiconductor structure 10, a gate structure 14 is formed on a substrate 12. The gate structure 14 includes a gate dielectric 14a, a gate electrode 14b, and a spacer 14c. Two recesses 16 (the dotted line) are formed in the substrate 12 adjacent to two sides of the gate structure 14. An epitaxial layer 18 is formed within the recesses 16 to serve as a source/drain region. Thereafter, a metal silicide layer 20 is formed on each up surface of the source/drain region and the gate structure 14. However, the resultant shape of the epitaxial layer 18 often becomes round without straight sides and it deviates very much from the original shape of the recess 16. In such result, the length of the gate channel 22 between the two recesses 16 under the gate structure 14 becomes longer than a predetermined one, and the stress effect of the epitaxial layer 18 to the gate channel 22 is reduced.

Therefore, there is still a need for a novel method of fabricating a semiconductor structure to solve the aforesaid issue.

SUMMARY OF THE INVENTION

An objective of the present invention is to provide a method of fabricating a semiconductor structure to avoid or reduce the rounding of the shape of the epitaxial layer.

The method of fabricating a semiconductor structure according to the present invention comprises steps as follows. First, a semiconductor substrate is provided. Next, a gate structure is formed on the semiconductor substrate. An etching process is performed to form at least one recess within the semiconductor substrate beside the gate structure. Thereafter, a thermal treatment process is performed on the recess in a gas atmosphere including an inert gas at a first temperature. After the thermal treatment process is performed, an epitaxy growth process is performed at a second temperature to form a silicon-containing epitaxial layer in the recess. During or after the epitaxy growth process, a dopant is incorporated into the silicon-containing epitaxial layer to form a source/drain region.

Without being bound to a theory, since, in the present invention, the recess is subject to a thermal treatment process in a gas atmosphere including an inert gas after it is formed, to alter or modify the bonding or adsorption relation of hydrogen (including atoms or ions) to the silicon of the semiconductor substrate, for example, to result in desorption of the hydrogen or alteration of the bonding type between the hydrogen and the silicon, such that the affect of the hydrogen during the subsequent epitaxy growth process can be alleviated or avoided. Accordingly, the resultant silicon-containing epitaxial layer grown in the recess may have a shape approximating to a designed or desired shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
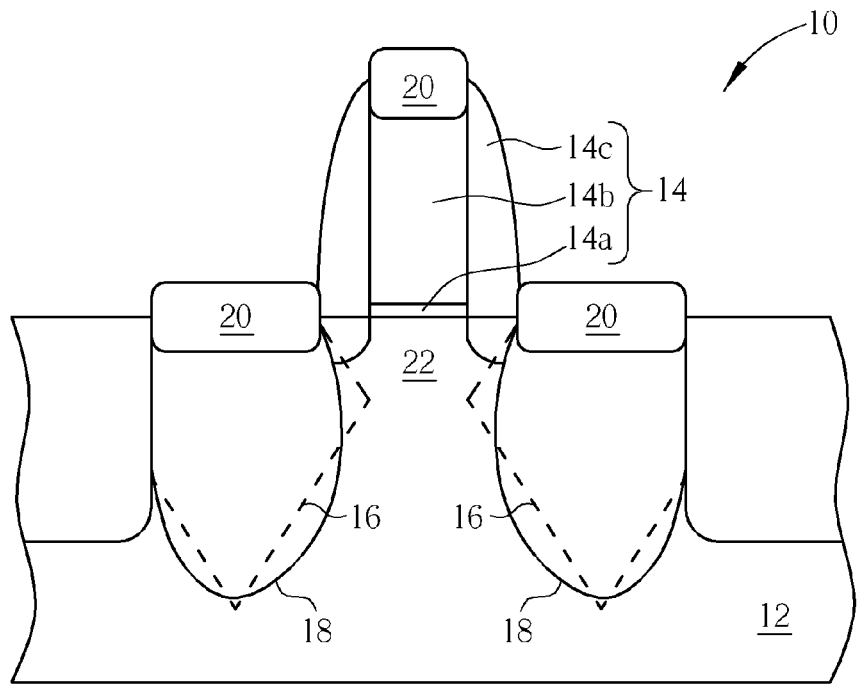
FIG. 1 is a schematic cross sectional view illustrating a semiconductor structure obtained using a conventional method.
Figure 2:
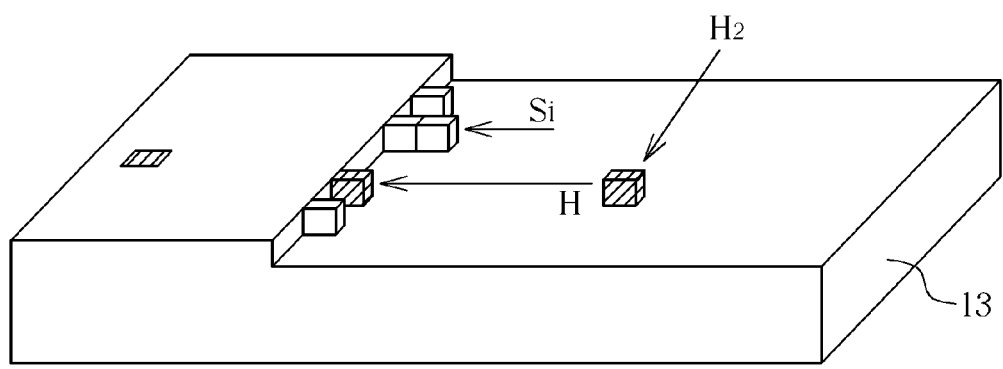
FIG. 2 is a presumed model.

The inventors investigated the rounding issue occurred in the conventional method and discovered that it may be resulted from the affect of the hydrogen to silicon migration at the high temperature of the epitaxy growth process. As shown in the presumed model of FIG. 2, hydrogen atoms or ions, provided from ambient atmosphere, substance from previous process, or cleaning solution containing hydrogen gas ($H_2$), hydrogen atoms, or hydrogen ions, are adsorbed on surface of the silicon substrate 13 or form chemical bonds with silicon atoms, especially at steps or corners of the silicon substrate 13. The hydrogen may trigger the migration of silicon atoms. Accordingly, when an epitaxy growth process is being carried out, silicon atoms located at these steps or in these corners migrate due to the existence of the hydrogen, such that the resultant epitaxial layer is significantly influenced to have a shape different from the shape of the recess originally formed. It may be noted that the word "hydrogen" is used sometimes herein to encompass hydrogen gas, hydrogen atom, and/or hydrogen ion for concise description.

For resolving the above-mentioned issue, a method of fabricating a semiconductor structure the present invention is provided and featured in that, after the recess is formed, a high-temperature thermal treatment is performed on the recess in a gas atmosphere including an inert gas to reduce or avoid silicon migration triggered by hydrogen during subsequent high-temperature epitaxy growth process. Presumably, high-temperature thermal treatment might alternate the adsorption or the bonding of the hydrogen within the recess (especially those hydrogen atoms located at the steps and in the corners) to the silicon. For example, the hydrogen is desorbed or the bonding type is altered, such that the hydrogen can not trigger the silicon migration anymore. In another presumption, the alternation of the adsorption or the bonding of the hydrogen might be resulted from a reaction with high-temperature oxygen. As a result, the method of the present invention may be advantageously utilized to fabricate MOS transistor structures, including pMOS and nMOS.

Figure 3:
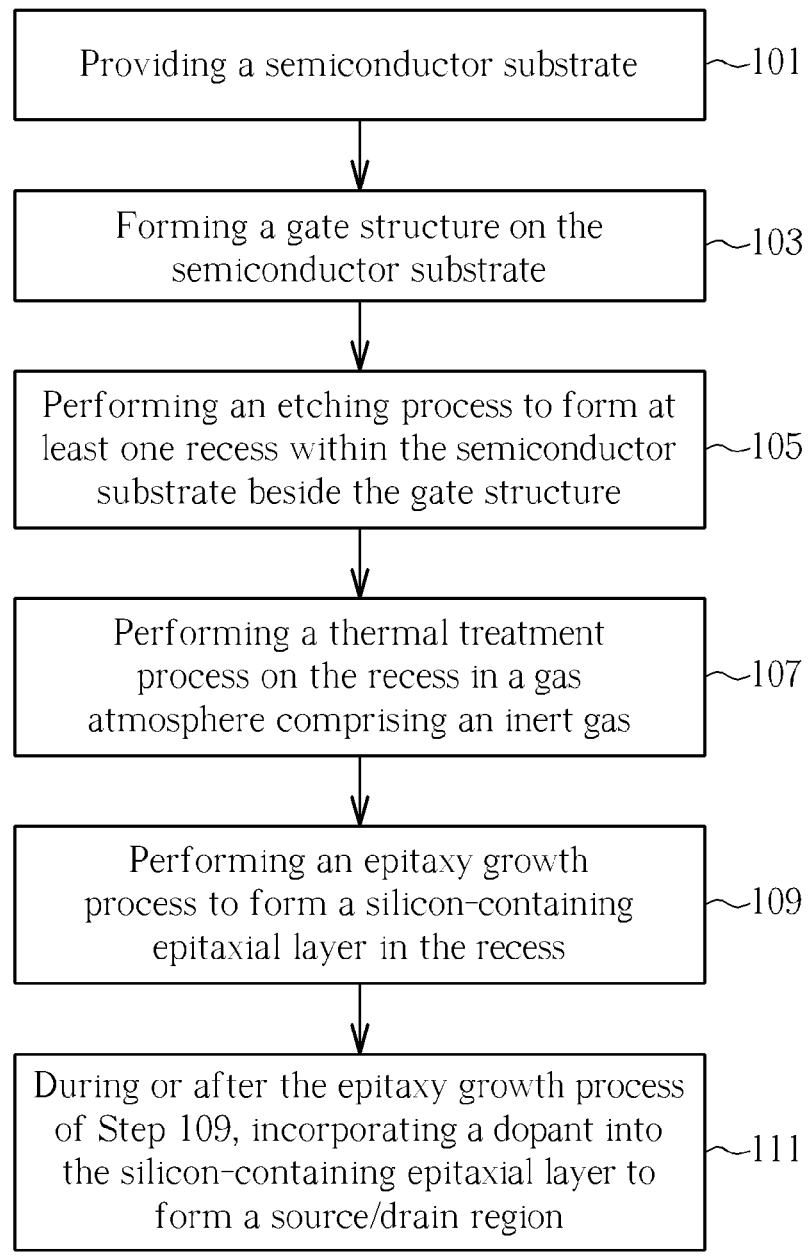
FIG. 3 is a flowchart illustrating an embodiment of the method of fabricating a semiconductor structure according to the present invention.

An embodiment of the method of fabricating a semiconductor structure according to the present invention is described hereinafter referring to FIG. 3 together with FIGS. 4 and 5. First, Step 101 is performed to provide a semiconductor substrate 12, such as silicon substrate. Next, Step 103 is performed to form a gate structure 14 on the substrate 12. The gate structure 14 may include a gate dielectric 14a, a gate electrode 14b, and a spacer 14c. The spacer 14c may be a single layer or a multilayer. Before the spacer 14c is formed, a lightly-doped source/drain (LDD) region 15 may be optionally formed through for example ion implantation.

Figure 4:
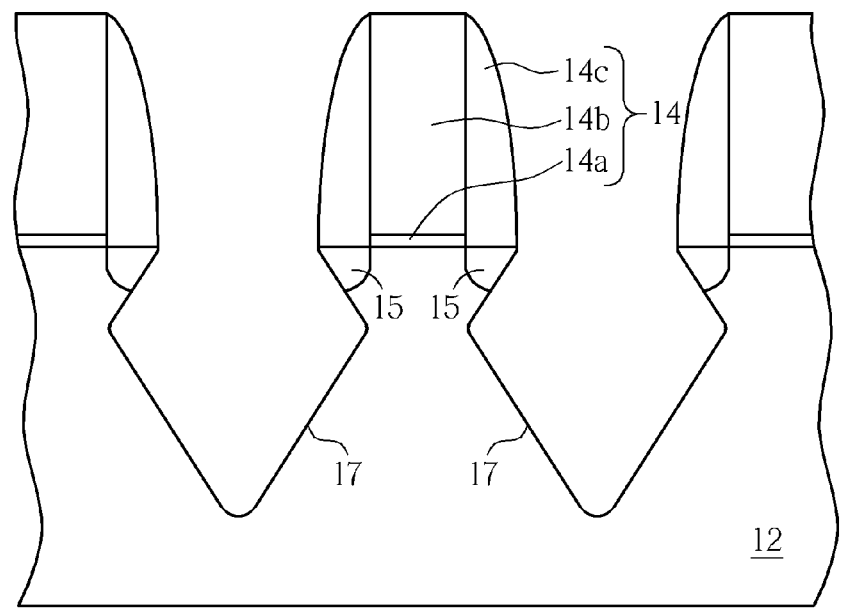
FIGS. 4 and 5 are schematic cross sectional views for illustrating an embodiment of a method of fabricating a semiconductor structure according to the present invention.

Thereafter, Step 105 is performed to form recesses 17 in the substrate 12 beside the gate structure 14 through an etching process, as shown in FIG. 4. The shape of the recess in the present invention is not particularly limited and can be designed as required. For example, the cross section of the recess may have a shape of polygon, for example, a polygon having four or more sides, such as octagon, hexagon, diamond shape, or pentagon. The polygon may have at least one angle further in a shape of curved angle or chamfered angle as desired.

Thereafter, Step 107 is carried out to perform a thermal treatment process on the recesses 17 in a gas atmosphere comprising an inert gas at a first temperature. A main objective of the thermal treatment process at high temperature is to destroy the adsorption or bonding of hydrogen to avoid or reduce influence of hydrogen to silicon, and thus it is not necessary for the thermal treatment to be long. For example, conventional rapid thermal process, spike thermal process, or spike laser thermal process may be utilized. The first temperature may be in a range from 850° C. to 1050° C., and preferably about 930° C. If the time for the thermal treatment is long, other elements on the substrate may be badly affected, and accordingly such situation should be avoided. The thermal treatment is performed in a gas atmosphere comprising an inert gas. The gas atmosphere may be one which is frequently utilized in a conventional semiconductor manufacturing process. For example, the gas atmosphere may be one, under normal pressure (1 atm), including an inert gas (which may be a single gas or a gas mixture) in a high concentration and an oxygen gas in an extremely low concentration. The inert gas may include nitrogen gas, helium, argon, and the like. The oxygen gas in an extremely low concentration is an amount of oxygen gas which typically and inevitably exists in the high-concentration inert gas prepared by the current technology. For example, the concentration of the oxygen gas may be less than 100 ppm. Therefore, the situation that an extremely low concentration of oxygen gas included in the gas atmosphere comprising an inert gas is not excluded from the present invention.

Figure 6:
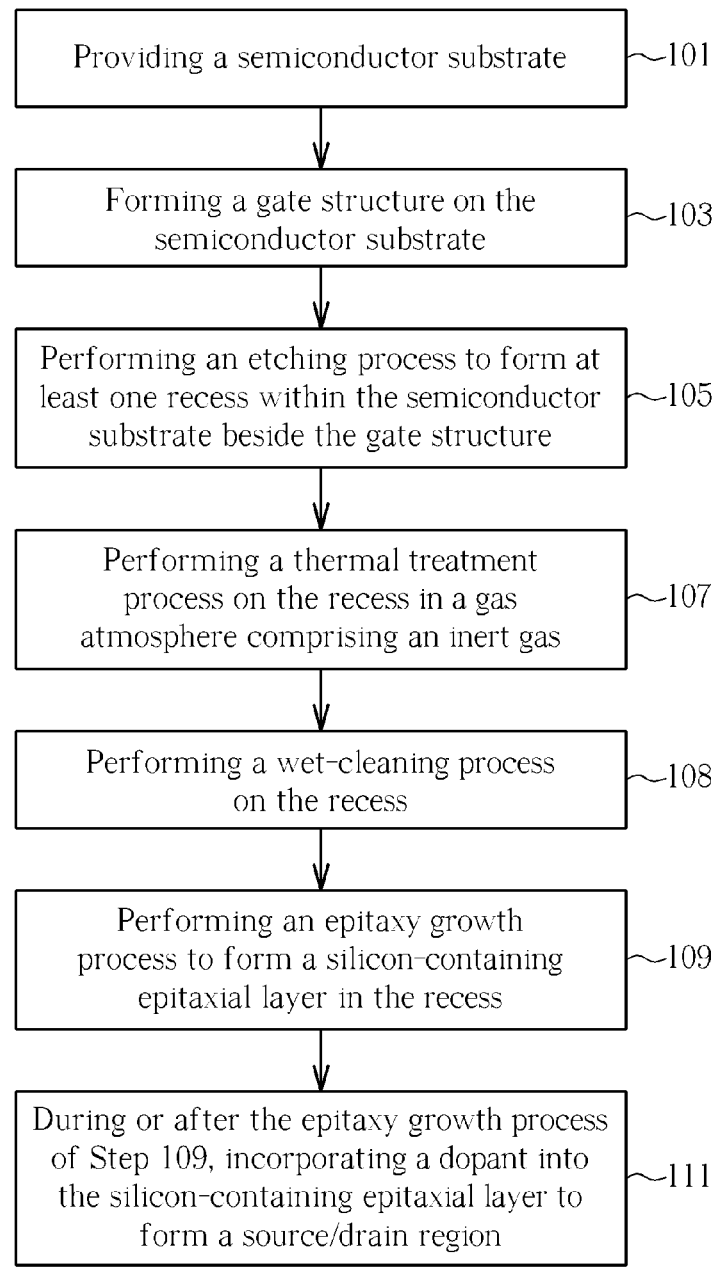
FIG. 6 is a flow chart illustrating another embodiment of the method of fabricating a semiconductor structure according to the present invention.

Furthermore, as shown in FIG. 6, in another embodiment of the present invention, after the thermal treatment process in Step 107 is performed, Step 108 may be performed optionally to wet-clean the recesses 17. Cleaning solution may include for example a diluted hydrogen fluoride solution, which is commonly utilized to remove native oxide layer in the industry.

Following Step 107 or Step 108 (if performed), Step 109 is carried out to perform an epitaxy growth process at a second temperature to grow a silicon-containing epitaxial layer 24 in each recess 17. The epitaxy growth process may be for example a selective epitaxy growth process. The silicon-containing epitaxial layer 24 may grow along the surface of the recess 17 and slightly protrude from the up surface of the substrate 12. The silicon-containing epitaxial layer may include for example those materials applicable to conventional strained silicon technology, such as silicon germanium (SiGe) or silicon carbide (SiC). The amount of germanium or carbon in the epitaxial layer may be as desired, for example, in a range from more than 0% to 50%, based on a total atom amount as 100%. The second temperature employed in the epitaxy growth process is preferably lower than the first temperature employed in the thermal treatment for the recess, but not limited thereto. The second temperature may be for example 600° C. to 900° C. For example, the substrate is pre-baked at 800° C., and the epitaxy growth is carried out in a range from 600° C. to 650° C.

Step 111 to form a source/drain may be performed during or after the epitaxy growth process of Step 109. The case that Step 111 and Step 109 are performed at the same time may be as follows for example. One is that the dopant of a desired concentration and the silicon-containing epitaxial material are allowed to epitaxially deposit within the recesses 17 together, to form source/drain regions. The concentration of the dopant may be varied by design according to the depth of the dopant in the epitaxial layer. Another is that the dopant may be from the substrate 12 (for example the source of the dopant may be implanted into the substrate 12 beside the gate structure 14 through ion implantation after the aforesaid spacer 14c is formed) and diffuse upon being heated during the epitaxial growth process to be incorporated into the silicon-containing epitaxial layer 24 to form source/drain regions. Alternatively, the case that Step 111 is performed following the epitaxy growth process of Step 109 may be for example that the dopant is doped into the silicon-containing epitaxial layer 24 through an ion implantation carried out on the silicon-containing epitaxial layer 24 to form source/drain regions.

Figure 5:
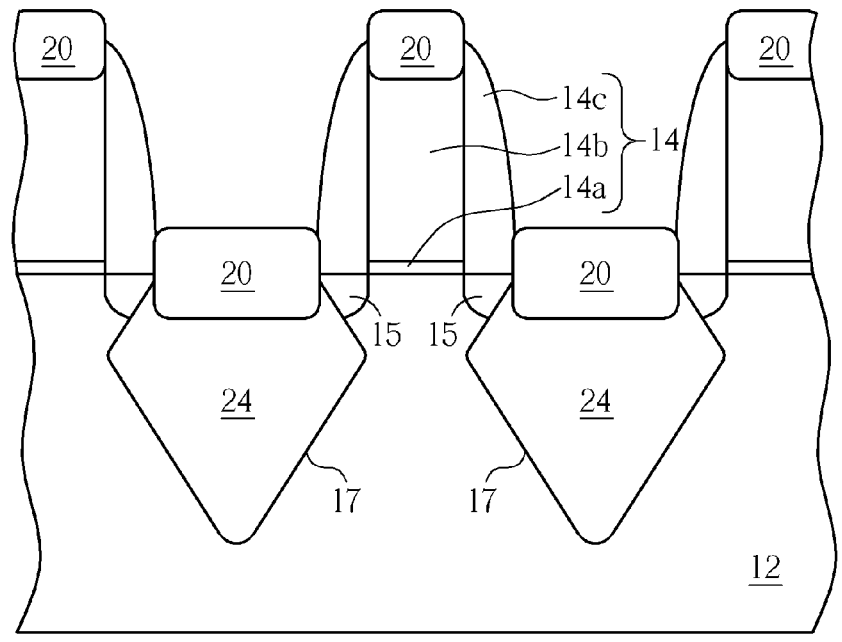

Thereafter, a self-aligned metal silicide (salicide) process may be performed to form a metal silicide layer 20, such as a nickel silicide layer, on the silicon-containing epitaxial layer 24 and the gate electrode 14b (if it is polysilicon), giving a semiconductor structure 30 as shown in FIG. 5.

Those skilled in the art will readily observe that numerous modifications and alterations of the device and method may be made while retaining the teachings of the invention.

What is claimed is:

1. A method of fabricating a semiconductor structure, comprising:
    providing a semiconductor substrate;
    forming a gate structure on the semiconductor substrate;
    performing an etching process to form at least one recess within the semiconductor substrate beside the gate structure;
    performing a thermal treatment process on the recess in a gas atmosphere comprising an inert gas at a first temperature;
    after performing the thermal treatment process, wet-cleaning the recess;
    after wet-cleaning the recess, performing a pre-bake process on the recess at a second temperature lower than the first temperature;

after performing the pre-bake process, performing an epitaxy growth process at a third temperature lower than the first temperature to form a silicon-containing epitaxial layer in the recess; and during or after the epitaxy growth process, incorporating a dopant into the silicon-containing epitaxial layer to form a source/drain region.

2. The method according to claim 1, wherein the thermal treatment process comprises a rapid thermal process, a spike thermal process, or a spike laser thermal process.

3. The method according to claim 1, wherein one cross section of the recess is substantially in a shape of polygon.

4. The method according to claim 3, wherein the polygon has at least one angle in a shape of curved angle or chamfered angle.

5. The method according to claim 1, wherein the epitaxy growth process comprises a selective epitaxy growth process.

6. The method according to claim 1, further comprising:
performing a self-aligned metal silicide process to form a metal silicide layer on the silicon-containing epitaxial layer.

7. The method according to claim 1, wherein the first temperature is in a range from 850° C. to 1050° C.

8. The method according to claim 1, wherein the second temperature and the third temperature are each in a range from 600° C. to 900° C.

9. The method according to claim 1, wherein the silicon-containing epitaxial layer comprises silicon-germanium (SiGe) or silicon-carbide (SiC).

10. The method according to claim 1, wherein, forming the gate structure comprises steps of forming a gate dielectric, a gate electrode, and a spacer.

11. The method according to claim 1, wherein wet-cleaning the recess includes utilizing a hydrogen fluoride solution to clean the recess.

* * * * *